(12) United States Patent
Dingle et al.

(10) Patent No.: US 8,680,444 B2
(45) Date of Patent: Mar. 25, 2014

(54) SOLDERING APPARATUS FOR CONNECTING SOLAR CELLS

(75) Inventors: Brad M. Dingle, Red Lion, PA (US); Brian S. Micciche, York, PA (US); Shawn M. Sidelinger, York, PA (US); Thomas R. Correll, Harrisburg, PA (US); Kenneth A. Neidert, Lewisberry, PA (US)

(73) Assignee: Komax Holding AG, Dierikon (CH)

( * ) Notice: Subject to any disclaimer, the term of this patent is extended or adjusted under 35 U.S.C. 154(b) by 1198 days.

(21) Appl. No.: 12/408,054

(22) Filed: Mar. 20, 2009

(65) Prior Publication Data

US 2009/0236328 A1    Sep. 24, 2009

Related U.S. Application Data

(60) Provisional application No. 61/038,161, filed on Mar. 20, 2008.

(51) Int. Cl.
  *B23K 1/002* (2006.01)

(52) U.S. Cl.
  USPC ............................. 219/616; 228/227

(58) Field of Classification Search
  USPC ................ 219/616, 600, 617, 615, 612, 673; 228/227, 231, 239, 240, 228, 234.1, 228/229
  See application file for complete search history.

(56) References Cited

U.S. PATENT DOCUMENTS 3,375,141 A * 3/1968 Julius ............................ 136/244
4,685,608 A * 8/1987 Kujas ............................. 228/227

FOREIGN PATENT DOCUMENTS

| DE | 203 11 931 U1 | 10/2003 | | |
|---|---|---|---|---|
| EP | 0 449 790 A2 | 10/1991 | | |
| EP | 0449790 | * 10/1991 | ............. | H01R 43/02 |
| EP | 06297137 | * 10/1994 | ............. | B23K 1/00 |
| EP | 1 355 346 A2 | 10/2003 | | |
| EP | 1 748 495 A1 | 1/2007 | | |
| JP | 10-302956 A | 11/1998 | | |
| JP | 10302956 | * 11/1998 | ............. | B23K 1/002 |
| JP | 2000-68043 A | 3/2000 | | |
| WO | WO 80/02662 A1 | 12/1980 | | |
| WO | WO 2008/151592 A1 | 12/2008 | | |

* cited by examiner

*Primary Examiner* — Henry Yuen
*Assistant Examiner* — Phuong Nguyen
(74) *Attorney, Agent, or Firm* — Fraser Clemens Martin & Miller LLC; William J. Clemens

(57) ABSTRACT

A soldering apparatus for connecting solar cells includes an induction heat source to connect cell conducting tracks, provided with soldering medium, with electric conductors. The heat source has a high-frequency generator and an inductor loop in which the flow of a high-frequency current causes a high-frequency magnetic field to induce in the conducting track and in the electric conductor arranged along the conducting track eddy currents that generate the heat that is necessary for the soldering operation. The U-shaped inductor loop has narrowings and widenings that serve to optimize the heat development in the soldering zone and thus also save energy. Each widening affords access to the soldering point for a magnetic-field-neutral pressure foot that presses the conductor onto the conducting track. The inductor loop extends the entire length of the conducting track of the cell upper and lower sides to solder to the conductor in one soldering operation.

13 Claims, 7 Drawing Sheets

SOLDERING APPARATUS FOR CONNECTING SOLAR CELLS

CROSS-REFERENCE TO RELATED APPLICATION

This application claims the benefit of U.S. provisional patent application Ser. No. 61/038,161 filed Mar. 20, 2008.

FIELD OF THE INVENTION

The invention relates to a soldering apparatus for connecting solar cells, wherein a heat source that operates on the induction principle connects conducting tracks of the solar cells, which are provided with soldering means, to electric conductors.

BACKGROUND OF THE INVENTION

From patent specification EP 1 748 495 A1 a soldering apparatus for the electrical connection of a plurality of solar cells has become known wherein provided on the surface of the cells are conducting tracks which can have applied to them an electrically conducting strip. The strip, by means of a heat source, is electrically connectable with the conducting track, and by means of inductive heating the heat source heats the conducting tracks and strip and melts a soldering medium that connects the strip with the conducting tracks.

SUMMARY OF THE INVENTION

The invention relates to a soldering apparatus that produces soldered connections by the induction principle in energetically economical manner.

The advantages achieved by the invention are that the soldering apparatus produces soldered connections between electric conductors with a low expenditure of energy. The heat required for the purpose is generated by means of an inductor loop, a high-frequency current that flows in the inductor loop generating a magnetic field that changes over time which causes eddy currents in the conductors that are to be joined and in the soldering medium, which in turn heat the conductors and melt the soldering medium. When the current is removed from the inductor loop, the conductors and the soldering medium cool, and the conductors are connected by means of the soldering medium. The high-frequency generator that is necessary to generate the current in the inductor loop can be dimensioned for less power and therefore less expensively.

Through the specific shape of the inductor loop, the magnetic field, and thus the current flowing through the inductor loop and the power of the high-frequency generator, can be optimized. With the inductor loop according to the invention, with the same length of inductor loop as hitherto, the power of the high-frequency generator can be reduced to one third or, with the same power of the high-frequency generator as hitherto, the length of the inductor loop can be tripled. The U-shaped inductor loop with wavy arms generates at the narrowings a weaker magnetic field, and at the widenings a stronger magnetic field, whereby effective soldering zones with favorable heat distribution are formed. In addition, at the center of each widening, the conductors that are to be joined to each other can be held down by means of a magnetic-field-neutral and electrically insulating pressure foot. In addition, the effective length of the inductor loop according to the invention can be easily adapted to the length of the soldered connection that is to be produced.

For this purpose, at the corresponding widening, an electric short-circuit is created, for example by manual or mechanical insertion of a bolt or screw.

DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

The U.S. provisional patent application Ser. No. 61/038,161 filed Mar. 20, 2008 is hereby incorporated herein by reference.

The following detailed description and appended drawings describe and illustrate various exemplary embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
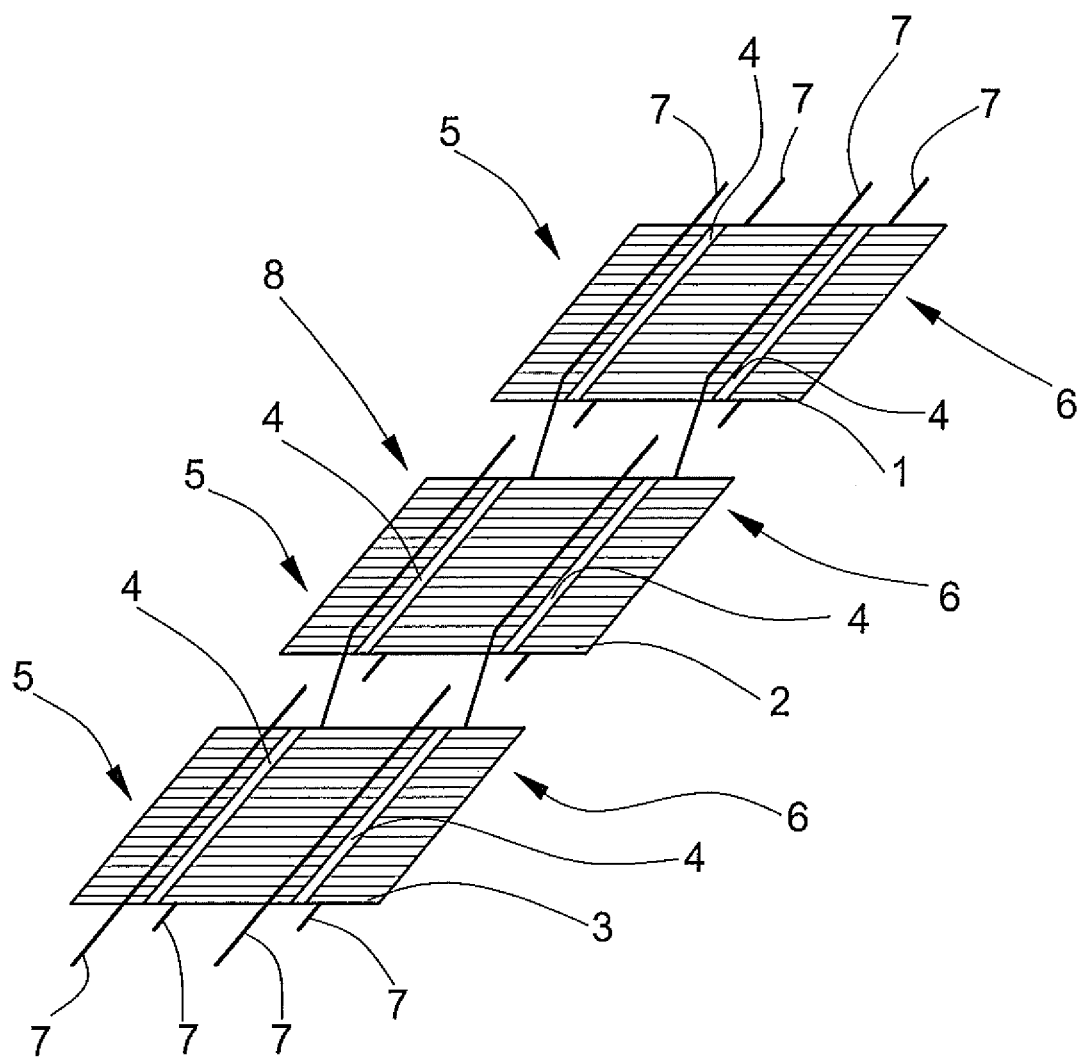
FIG. 1 is a schematic perspective view of a plurality of solar cells that are electrically connected into a cell string.

FIG. 1 shows a first solar cell 1, a second solar cell 2, and a third solar cell 3. The solar cells 1, 2, 3 are also referred to as photovoltaic cells and convert the radiant energy contained in light into electrical energy. The voltage that is generated in the individual cells prevails between conducting tracks 4 of the cell upper side 5 and conducting tracks of the lower side 6 of the cell that are not visible in FIG. 1. If the conducting tracks 4 of the cell upper side 5 and the conducting tracks of the cell lower side 6 are connected in a circuit to an electric load, for example an ohmic resistance or battery, an electric current flows, and the energy that is generated by the solar cell is consumed in the load or stored in the battery respectively. A plurality of solar cells is electrically connected together into a string. A plurality of strings form a module, also referred to as a panel. On the conducting tracks 4 of the cell upper side 5, and on the conducting tracks of the cell under side 6, the solar cells are connected in series. The voltages of the individual cells thus add, and thinner conductors 7 can be used for connecting them together.

In FIG. 1 the first solar cell 1, the second solar cell 2, and the third solar cell 3 are electrically connected together into a cell string 8. A conductor 7 connects a conducting track 4 of the cell upper side 5 of the first solar cell 1 with the conducting track of the cell lower side 6 of the second solar cell 2. A conductor 7 connects a conducting track 4 of the cell upper side 5 of the second solar cell 2 with the conducting track of the cell lower side 6 of the third solar cell 3.

The connection between the conducting track 4 and the conductor 7 is produced by means of a soldering operation, wherein a heat source heats the conductor 7 and the conducting track 4 that is provided with soldering medium, and the soldering medium, for example a soft solder, melts, the liquid soldering medium wetting the conducting track 4 and the conductor 7. Under the effect of the heat, a solid electrically conducting connection comes into being between the conducting track 4 and the conductor 7.

To produce the soldered connection, different types of heat generation can be used. As stated above, particularly advantageous is a heat source that operates on the induction principle, wherein a high-frequency generator generates a high-frequency current with a frequency of, for example, 800 kHz to 900 kHz in an inductor loop, which gives rise to a high-frequency magnetic field.

Figure 2:
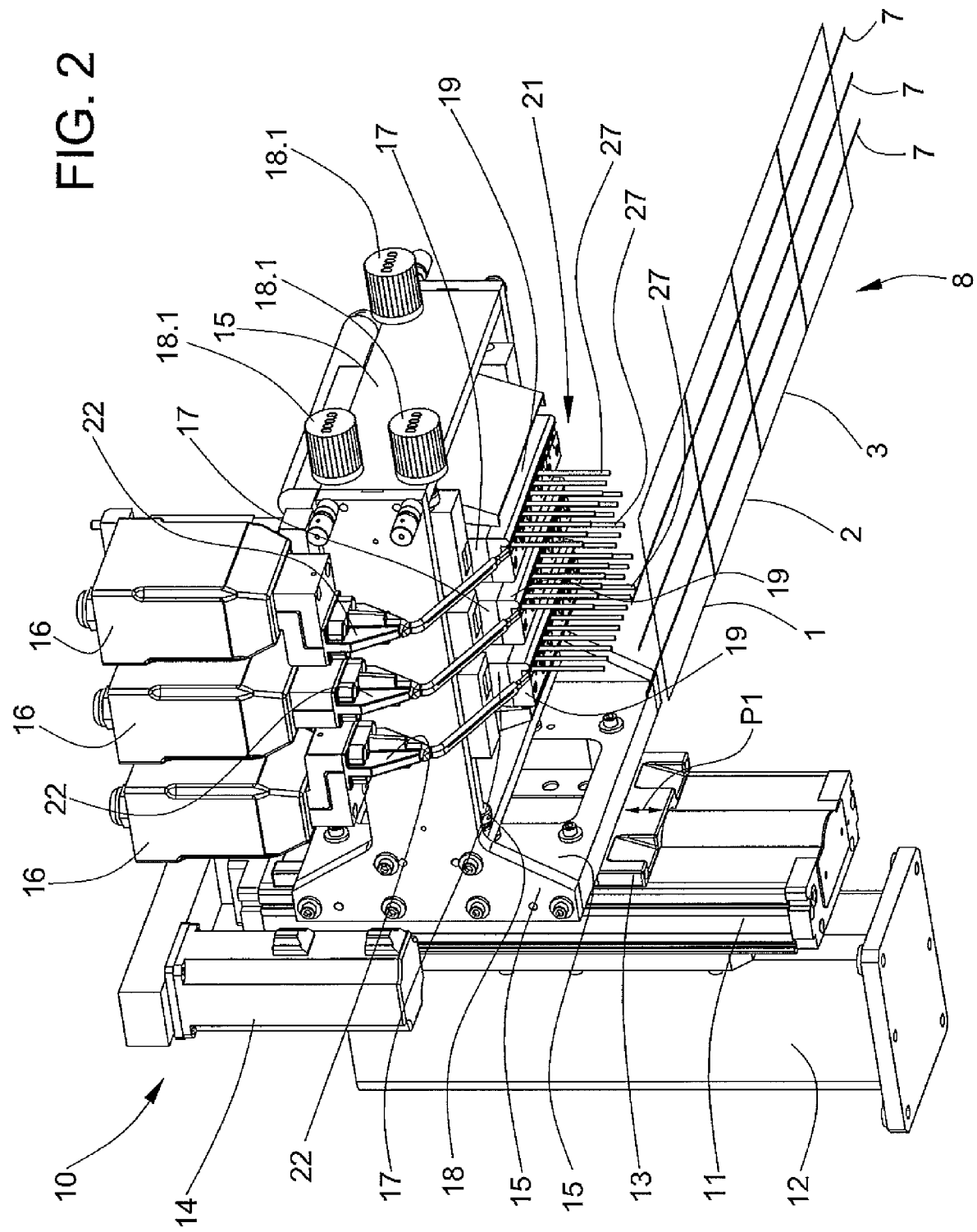
FIG. 2 is a perspective view of a soldering head with an inductor loop according to the invention.
Figure 3:
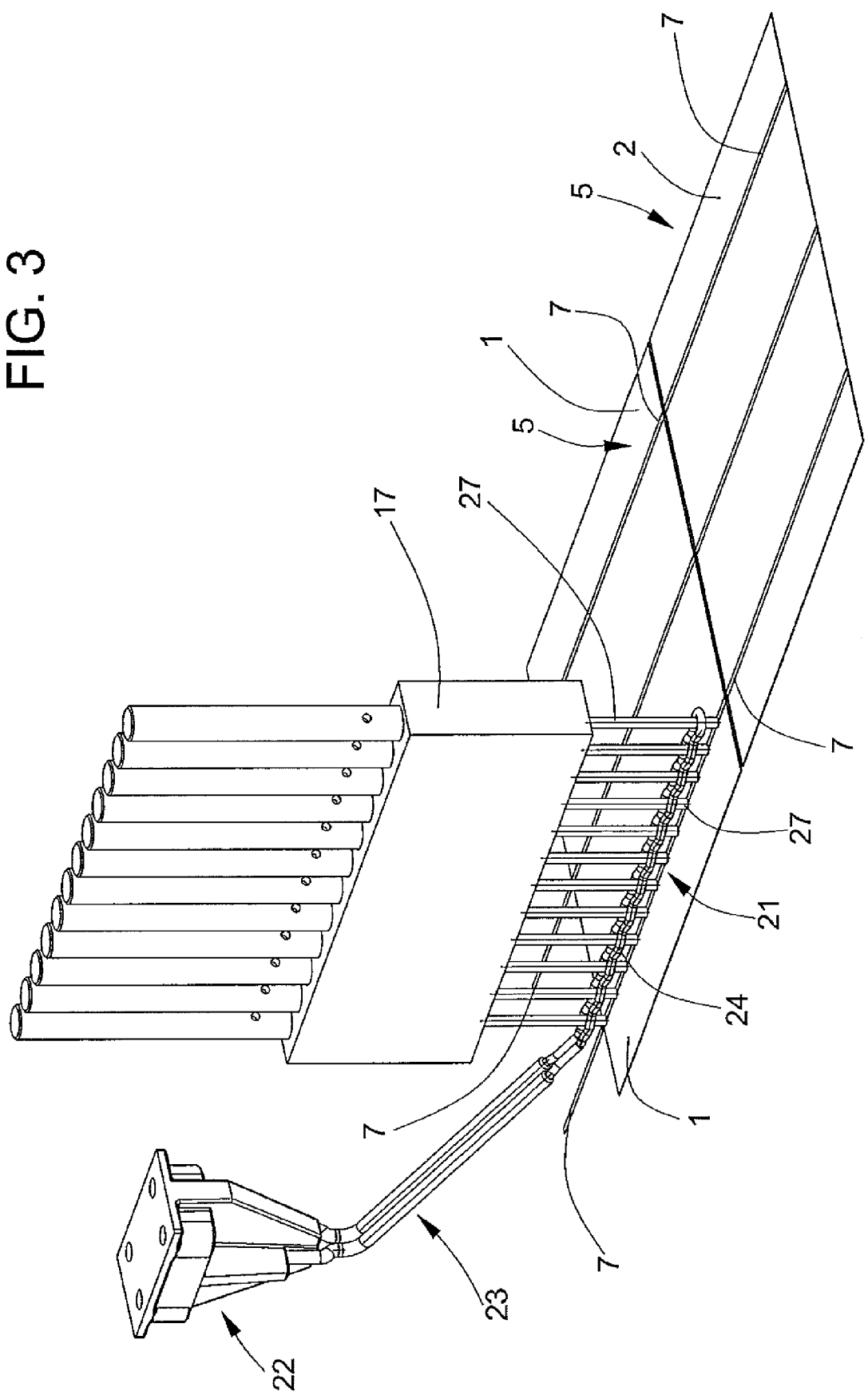
FIG. 3 is a perspective view the inductor loop shown in FIG. 2 with a pressure foot.
Figure 4:
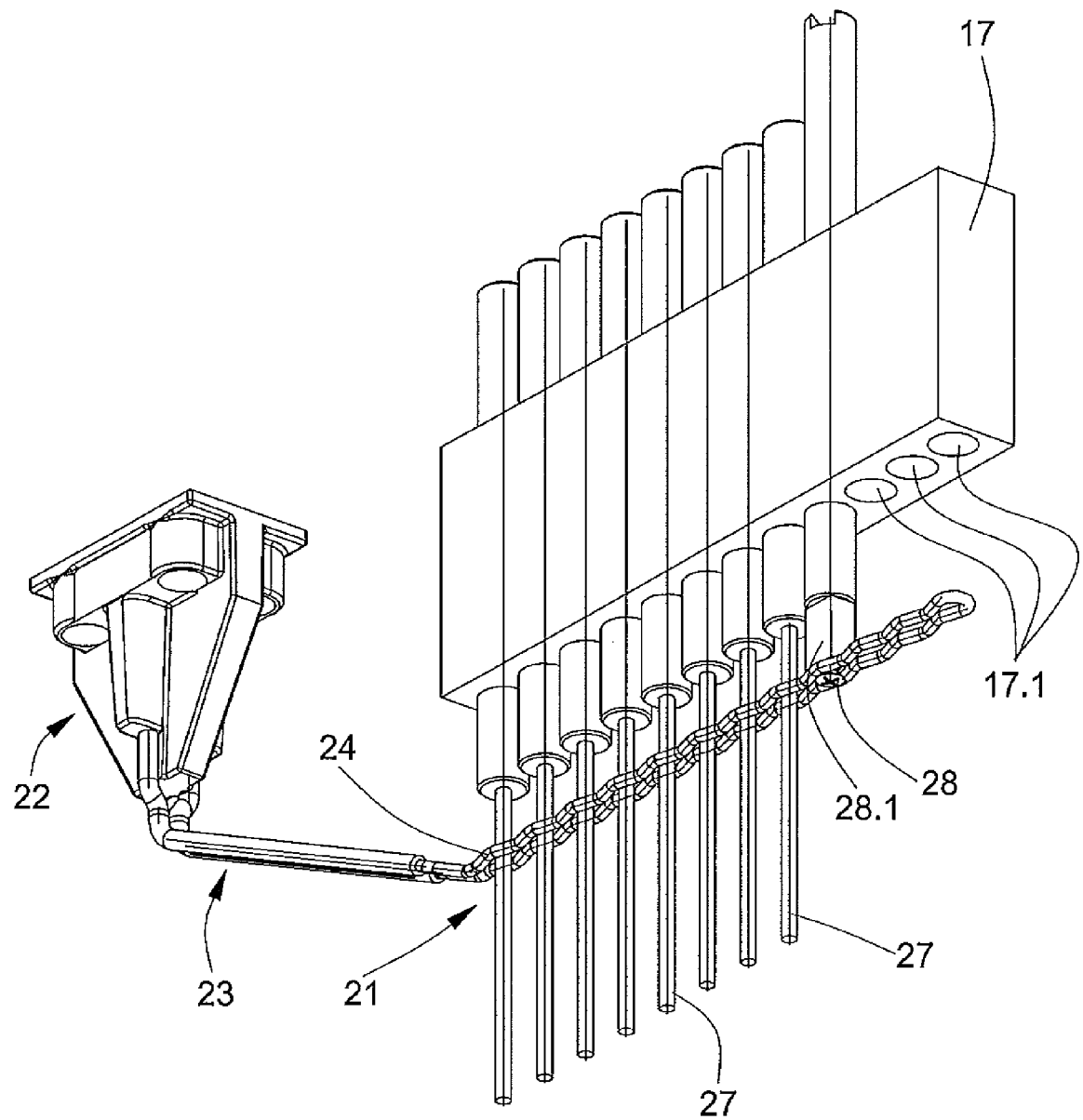
FIG. 4 is a perspective view and FIG. 5 is a plan view of the inductor loop shown in FIG. 3 whose effective length is settable.

FIG. 2 shows a soldering head 10 equipped with three inductor loops 21. A linear guide 11 is arranged on a stand 12, the linear guide 11 of the guide serving as a slide 13 which, by means of a motor 14, is movable up and down as symbolized with an arrow P1. The slide 13 serves as support for a housing 15, arranged on which are connecting blocks 16, guide blocks 17, an adjusting spindle 18 for the inductor loops 21, and pressure feet 27. Provided for each inductor loop 21 is an adjusting spindle 18, by means of which, with an adjusting nut 18.1, the position of the inductor loop 21 and of the pressure foot 27 is manually alignable on the respective conducting track 4 of the solar cell. The loop element 24 is set into a plate 19, for example of plastic, which is arranged on the guide block 17 (FIG. 3). Each pressure foot 27 is freely movable in a vertical drilled hole 17.1 in the guide block 17 (FIG. 4). When the soldering head 10 is lowered in the direction of the solar cell 1, 2, 3, the pressure feet 27 rest on the conductor 7 and, through their own weight, press the conductor 7 onto the conducting track 4.

FIG. 2 shows the solar cells with three parallel conducting tracks 4. With the soldering head 10 shown, by means of the three inductor loops 21 the three conducting tracks 4 can be soldered simultaneously along their entire cell length.

If solar cells with two conducting tracks 4 are processed or soldered, a connecting block 16, a guide block 17 with the inductor loop 21 and the pressure foot 27 are removed. For solar cells with more than three conducting tracks 4, the soldering head 10 can also be constructed larger than shown, and have more than three inductor loops 21.

The connecting block 16 serves as a support for the inductor loop 21 and comprises the water connection, the electric connection, and the high-frequency generator for generating the high-frequency current in the inductor loop 21.

Figure 5:
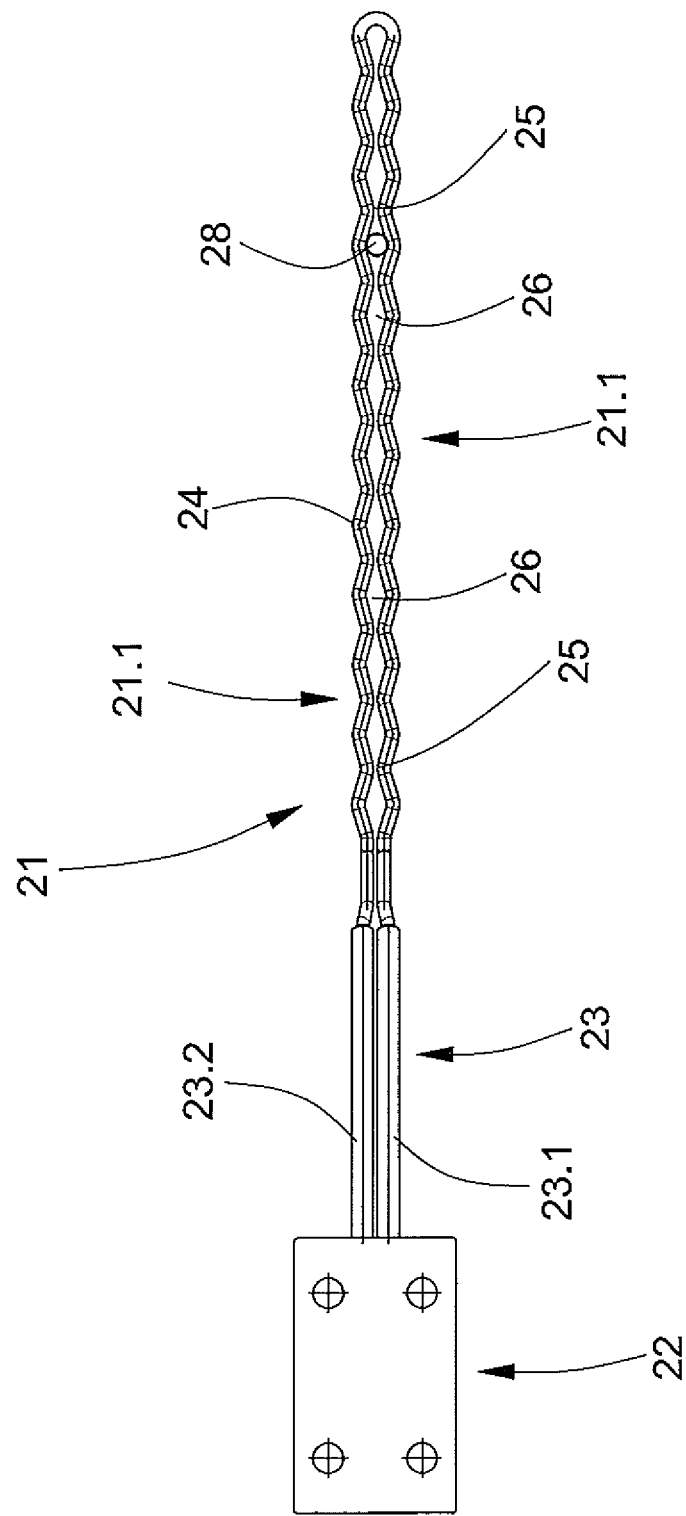
Figure 5A:
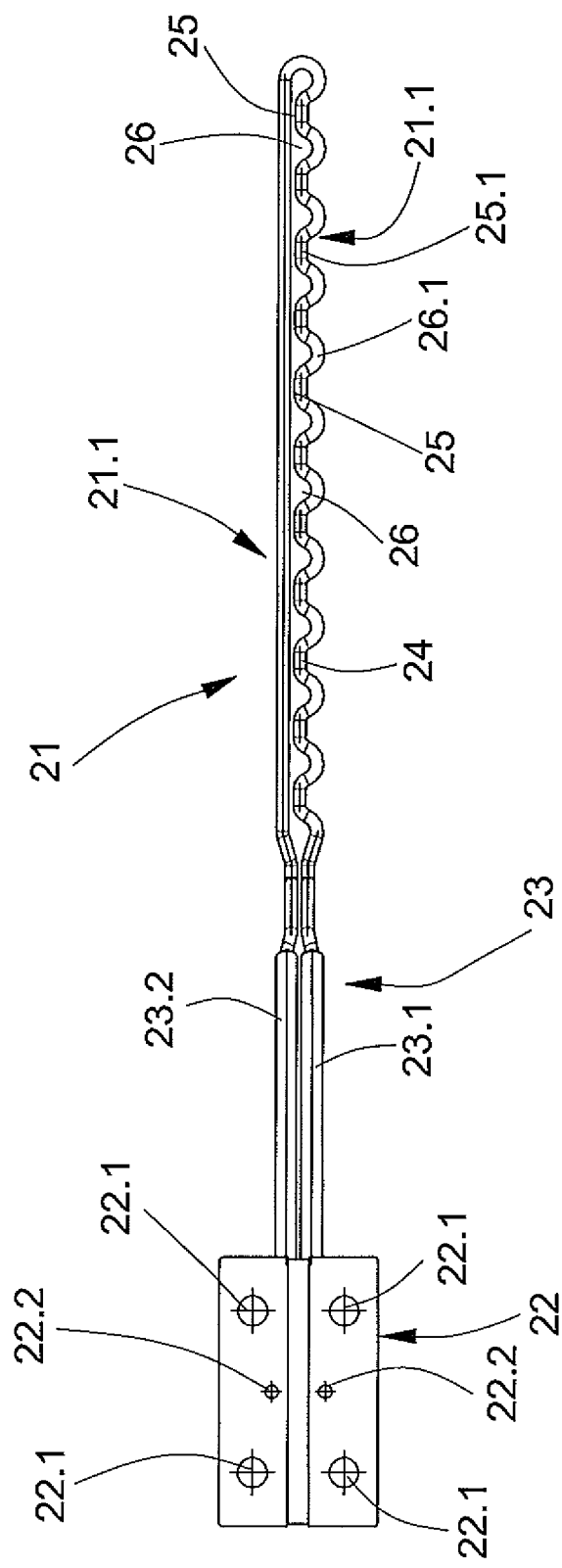
FIG. 5a is a plan view of an alternate embodiment of the inductor loop shown in FIG. 5.

FIG. 3 shows an inductor loop 21, without the plate 19, that is arranged on the soldering head 10. The inductor loop 21 consists of a connecting piece 22, a feeder element 23, and of a U-shaped loop piece 24, at least one arm of the "U" being wavy. The feeder element 23 and the loop element 24 take the form of hollow conductors, and have flowing through them a coolant, for example water. The feeder element 23 consists of two tubes 23.1, 23.2 lying close to each other, which feed the coolant to the loop element 24 and drain it away from the loop element 24 (FIG. 5). The loop element 24 consists of a tube which is formed into a U-shape with two arms 21.1 and closely approximates to the form of a hairpin (FIG. 5). The free ends of the tube are connected with the tubes of the feeder element 23. The tubes of the feeder element 23 and the tube of the loop element 24 are of electrically conducting material as, for example, copper. The U-shaped tube has, as indicated in FIGS. 5, 5a, narrowings 25 and widenings 26. As described further above, the narrowings 25 and widenings 26 serve to optimize the heat development in the solder zone, and thus also the saving of energy. Each widening 26 affords access to the soldering point for a magnetic-field-neutral pressure foot 27 of, for example, ceramic, which presses the conductor 7 onto the conducting track 4. With the inductor loop 21 shown in FIG. 3, the entire length of the conducting track 4 of the cell upper side 5 of a solar cell 1, 2, 3 can be soldered to the conductor 7 in one soldering operation. The magnetic field of the inductor loop 21, or more specifically the eddy currents in the conducting track 4 and in the conductor 7, can also simultaneously heat the conducting track and the conductor, and melt the soldering medium of the cell lower side 6, and produce a soldered joint between the conducting track 4 and the conductor 7.

FIG. 4 and FIG. 5 show the inductor loop 21 whose effective length is settable. The dimensions of the loop element 24 correspond to the dimensions of the loop element 24 of FIG. 3. Depending on need, or depending on the size of the solar cell that is to be soldered, the effective length can be reduced. A screw 28 that is inserted in a widening 26, or a bolt 28 that is inserted in a widening 26, short-circuits the loop element 24. The high-frequency current can flow from the high-frequency generator and generate a magnetic field only as far as the screw or bolt 28. The screw or bolt 28 can be releasably connected with the soldering head and manually or mechanically inserted. The supernumerary pressure feet 27 have been removed, or fixed in a higher position, and a threaded bolt 28.1 for the screw 28 has been inserted in the widening 26 with the drilled hole 17.1 that corresponds to the screw 28.

The form of the widenings 26 and of the narrowings 25 also depends on the manufacturing technology. Critical for optimization of the power consumption is mainly the alternatingly reduced and expanded distance between the tubes. In the example of FIG. 5, the bending radii of the widenings 26 and narrowings 25 are chosen large, so that the loop element 24 can be produced from one tube, in one piece, in one bending operation. If a shape is chosen with small bending radii, for example a zigzag shape, the loop element 24 must be assembled from individual elements for the widening 26 and narrowing 25.

FIG. 5a shows the loop element 24 with a shape which, with respect to the bending radii, can still be produced with one bending operation. The tube, more specifically the one arm 21.1 of the U-shaped loop element 24, is formed straight, and the other leg 21.1 of the loop element 24 is formed wavy with the widenings 26 and the narrowings 26. Provided for the widenings 26 is an arc-shaped section 26.1, and provided for the narrowings 25 is a straight section 25.1, the pressure feet 27 fitting into the widenings 26.

Figure 6:
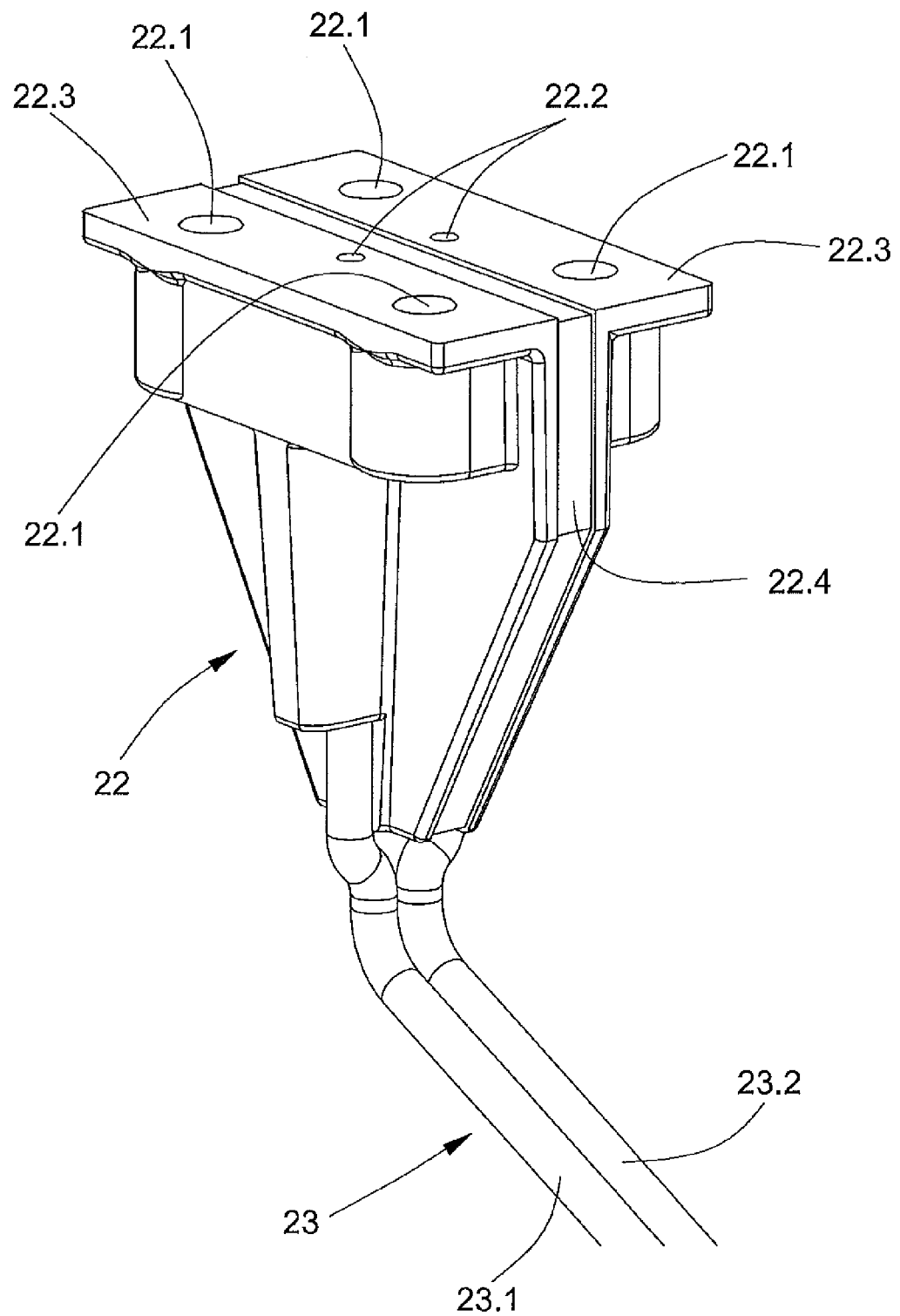
FIG. 6 is an enlarged perspective view of the connecting piece of the inductor loop shown in FIG. 3.

FIG. 6 shows details of the connecting piece 22 of the inductor loop 21. The connecting piece 22 is releasably connected to the connecting block 16 by means of screws that penetrate drilled holes 22.1. The water connection 22.2 is also connected to the connecting block 16 and is sealed by means of a not-shown O-ring at the connector-block end. The coolant circuit for cooling the loop element 24 is thus closed. Electrically, the connecting piece 22 is connected to the connecting block 16 by means of contact surfaces 22.3, the contact surfaces 22.3 being electrically separated be means of an insulation plate 22.4.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A soldering apparatus for connecting solar cells including a heat source that operates on the induction principle and connects conducting tracks of the solar cells, that are provided with soldering medium, with electric conductors, comprising:
   a high-frequency electrical current generator; and
   an inductor loop connected to said generator for receiving a high-frequency electrical current, wherein said inductor loop is formed in a U-shape having at least one arm in a wave shape, wherein flowing of the high-frequency electrical current through said inductor loop generates a high-frequency magnetic field, said inductor loop being shaped to extend along a length of one of the conducting tracks, wherein said magnetic field induces in the one conducting track, in an electric conductor that is arranged along the one conducting track and in an associated soldering medium eddy currents that generate heat and perform a soldering operation connecting the one conducting track and the electrical conductor mechanically and electrically together, and wherein said inductor loop has another arm extending generally parallel to said at least one arm, said at least one arm having a plurality of alternating widenings and narrowings relative to said another arm, wherein the widenings are defined by a maximum distance between adjacent portions of said at least one arm and said another arm, and the narrowings are defined by a minimum distance between adjacent portions of said at least one arm and said another arm, wherein the widenings and narrowings are spaced apart consecutively and substantially linearly along a length of said at least one arm and energetically optimize the high-frequency magnetic field and provide energetically economical operation of said high-frequency generator,
   wherein each of the widenings has substantially a same size and is configured to receive an associated magnetic-field-neutral pressure foot.

2. The soldering apparatus according to claim 1 wherein said inductor loop is formed as a tube in which coolant flows.

3. The soldering apparatus according to claim 1 wherein an effective length of said inductor loop is settable by applying an electrical short-circuit between said at least one arm and said another arm of said inductor loop at a selected one of a plurality of positions along a length of said inductor loop.

4. The soldering apparatus according to claim 3 wherein said inductor loop has said widenings and narrowings spaced along a length thereof and including a screw or a bolt inserted into one of said widenings, said screw or said bolt electrically short-circuiting said inductor loop at said one widening.

5. The soldering apparatus according to claim 1 wherein said inductor loop has said widenings and narrowings spaced along a length thereof, and including for each said widening the associated magnetic-field-neutral pressure foot that penetrates through said associated widening and presses the conductor onto the one conducting track.

6. The soldering apparatus according to claim 1 including a soldering head provided with a number of said inductor loops corresponding to a number of the conducting tracks of the solar cells that are to be connected to the conductors, all of the conducting tracks of each of the solar cells being soldered to the conductors simultaneously and along the entire length of the conducting tracks.

7. The soldering apparatus according to claim 1 wherein said another arm has a plurality of alternating widenings and narrowings spaced along a length thereof, wherein said widenings of said at least one arm are opposite said widenings of said another arm and wherein said narrowings of said at least one arm are opposite said narrowings of said another arm.

8. The soldering apparatus according to claim 1 wherein the wave shape of the at least one arm is in the form of a zigzag.

9. A soldering apparatus for connecting solar cells including a heat source that operates on the induction principle and connects conducting tracks of the solar cells, that are provided with soldering medium, with electric conductors, comprising:
   a high-frequency electrical current generator;
   an inductor loop connected to said generator for receiving a high-frequency electrical current, wherein flowing of the high-frequency electrical current through said inductor loop generates a high-frequency magnetic field, said inductor loop being shaped to extend along a length of one of the conducting tracks wherein said magnetic field induces in the one conducting track, in an electric conductor that is arranged along the one conducting track and in an associated soldering medium eddy currents that generate heat and perform a soldering operation connecting the one conducting track and the electrical conductor mechanically and electrically together, said inductor loop having a pair of arms extending in parallel, at least one of said arms having a plurality of alternating widenings and narrowings relative to another one of said arms, wherein the widenings are defined by a maximum distance between adjacent portions of said at least one arm and said another arm, and the narrowings are defined by a minimum distance between adjacent portions of said at least one arm and said another arm, wherein the widenings and narrowings are spaced apart consecutively and substantially linearly along a length of said at least one arm; and
   a screw or a bolt inserted into one of said widenings, said screw or said bolt electrically short-circuiting said inductor loop at said one widening to set an effective length of said inductor loop, and
   wherein each of the widenings has substantially a same size and is configured to receive an associated magnetic-field-neutral pressure foot.

10. The soldering apparatus according to claim 9 including for each said widening the associated pressure foot formed of a magnetic-field-neutral material wherein said pressure foot penetrates through said associated widening and presses the conductor onto the conducting track.

11. The soldering apparatus according to claim 9 wherein each of said arms has a plurality of alternating widenings and narrowings spaced along a length thereof, wherein each of said widenings in a first one of said arms is opposite one of said widenings in a second one of said arms, and wherein each of said narrowings in said first arm is opposite one of said narrowings in said second arm.

12. A soldering apparatus for connecting solar cells including a heat source that operates on the induction principle and connects conducting tracks of the solar cells, that are provided with soldering medium, with electric conductors, comprising:
   a high-frequency electrical current generator;
   a soldering head; and
   a plurality of inductor loops attached to said soldering head and each corresponding to an associated conducting track of the solar cells, each said inductor loop being connected to said generator for receiving a high-frequency electrical current, wherein flowing of the high-frequency electrical current through each said inductor loop generates a high-frequency magnetic field, each said inductor loop being shaped to extend along a length of the associated conducting track and having a pair of arms extending in parallel, at least one of said arms with a plurality of alternating widenings and narrowings relative to another one of said arms, wherein the widenings are defined by a maximum distance between adjacent portions of said at least one arm and said another arm, and the narrowings are defined by a minimum distance between adjacent portions of said at least one arm and said another arm, wherein the widenings and narrowings are spaced apart consecutively and substantially linearly along a length of said at least one arm, wherein each of the widenings has substantially a same size and is configured to receive an associated magnetic-field-neutral pressure foot, wherein said magnetic field induces in the associated conducting track, in an electric conductor that is arranged along the associated conducting track and in an associated soldering medium eddy currents that generate heat and perform a soldering operation connecting the associated conducting track and the electrical conductor mechanically and electrically together, all of the conducting tracks of each of the solar cells being soldered to the conductors simultaneously and along the entire length of the conducting tracks.

13. The soldering apparatus according to claim 12 wherein each of said arms has a plurality of alternating widenings and narrowings spaced along a length thereof, wherein each of said widenings in a first one of said arms is opposite one of said widenings in a second one of said arms, and wherein each of said narrowings in said first arm are opposite one of said narrowings in said second arm.

* * * * *